United States Patent
Tu et al.

[19]

[11] Patent Number: 5,811,344
[45] Date of Patent: Sep. 22, 1998

[54] METHOD OF FORMING A CAPACITOR OF A DRAM CELL

[75] Inventors: Tuby Tu; Kuang-Chao Chen; May Wang, all of Hsin-Chu, Taiwan

[73] Assignee: Mosel Vitelic Incorporated, Taiwan

[21] Appl. No.: 789,495

[22] Filed: Jan. 27, 1997

[51] Int. Cl.[6] .................................................. H01L 21/72
[52] U.S. Cl. .................. 438/396; 438/398; 438/253; 438/255; 361/321.1; 361/321.4; 361/321.5
[58] Field of Search .................................... 257/306–311; 437/47, 60; 361/321.1–321.5, 311–313, 322; 438/197, 238–241, 250, 253–256, 381, 387, 393–398, 689, 706, 745, 753; 430/314–319

[56] References Cited

U.S. PATENT DOCUMENTS 5,082,797 1/1992 Chan et al. ............................ 437/52
5,130,885 7/1992 Fazan et al. .......................... 361/313
5,213,992 5/1993 Lu .......................................... 437/52

*Primary Examiner*—Bot L. Ledynh
*Attorney, Agent, or Firm*—Bacon & Thomas

[57] ABSTRACT

The present invention relates to a stacked capacitor of a DRAM cell, particularly remarkably increasing a surface area of a storage electrode of a stacked capacitor without increasing an occupation area and a complexity of fabrication thereof. According to the invention, by use of depositing a protection polysilicon layer on a rugged polysilicon layer, which can provide an increased surface area of a storage electrode, a chemical oxide layer underlying the rugged polysilicon layer is protected by the protection polysilicon layer during a HF dip and thus a peeling of the rugged polysilicon layer as a result of the chemical oxide loss will not occur, thereby preventing a production yield loss.

3 Claims, 2 Drawing Sheets

METHOD OF FORMING A CAPACITOR OF A DRAM CELL

DESCRIPTION OF THE PRIOR ART

Significant progress has recently been made in a semiconductor memory device. Especially, in a dynamic random access memory (to be referred to as a DRAM hereafter), various attempts to provide a high integration density have been made without decreasing storage characteristics thereof. A DRAM cell comprises a single field effect transistor and a single capacitor. The field effect transistor has one conduction terminal connected to a storage electrode of the capacitor and another conduction terminal connected to a bit line BL. In addition, the field effect transistor has a gate electrode connected to a word line WL. The capacitor has other electrodes connected to the ground. Many DRAM cells are arranged in a matrix form to store large quantities of information. At the time of writing data, since a predetermined potential is applied to the word line WL so that the field effect transistor is rendered conductive, charge from the bit line BL is stored in the capacitor.

On the other hand, at the time of reading out data, since a predetermined potential is applied to the word line WL so that the field effect transistor is rendered conductive, charge stored in the capacitor is extracted through the bit line BL. Accordingly, information "0" and "1" is represented by electric charge and no charge (or alternatively, no charge and electric charge) on the storage electrode of the stacked capacitor. During the reading cycle, the capacitor also shares charge with the bit line BL capacitance. The ratio of the two capacitances has to be high enough to ensure that a resultant voltage can be detected by a sense amplifier. Hence, it is expected that the capacitance of the capacitor should be raised as such as possible to improve the signal to noise (S/N) ratio of a DRAM cell while maintaining the sane occupation area and the complexity of fabrication as that of conventional art.

Mostly, the capacitor of a DRAM cell comprises a storage electrode of a polysilicon layer, a plate electrode of a polysilicon layer, and a dielectric film of stacked ONO (Oxide-Nitride-Oxide) layer. Although thinning the dielectric film can provide a method for increasing the capacitance of a capacitor, the dielectric film with thinner film thickness will cause a reliability problem since the number of defects such as pinholes increases, the yield thereof decreases and, in addition, the electric field strength applied to the dielectric file increases to cause a dielectric breakdown. Therefore, the dielectric film has a limited film thickness and thus enlarging the area of the storage electrode is another method of providing a higher capacitance. However, if the area of a capacitor is enlarged, the occupation area of a DRAM cell will be increased, resulting in a big obstacle in implementation of a highly integrated device with a large memory capacity.

Presently, in order to overcome said problems, a stacked capacitor is often used as a charge storage capacitor of a DRAM cell. An improved stacked capacitor, which uses a rugged polysilicon layer as a storage electrode, can further provide higher capacitance because of larger surface area of a storage ekectrode. For example such an improved stacked capacitor was disclosed in J. Vacuum Science Technology ;B Vol., Page 751, 14(2), 1996. author M.Ino. Referring to FIG. 1, after finishing a field oxide 30, a gate oxide 20, source/drain regions S/D, and a polysilicon gate 40 over a silicon substrate 10, which are all standard IC processes and not described in detail here, a dielectric layer 50 such as $SiO_2$ is deposited to protect the polysilicon gate 40. A contact window (not shown in FIG. 1), providing a connection between source/drain regions S/D and a storage electrode, is then formed by exposing through a contact mask, developing and etching the dielectric layer 50.

Subsequently, a pad polysilicon layer is formed on the contact window by a chemical vapor deposition (CVD) method. The wafer is then immersed in a sulfuric acid peroxide mixing (SPM) solution, which is a mixed solution of $H_2SO_4$ and $H_2O_2$, to grow a porous chemical oxide 70 to a thickness of 15–20 A. Finally, a rugged polysilicon layer 80 consisting of many grains is formed by depositing an amorphous silicon layer and then annealing at a temperature of 585° C. These grains will make the polysilicon layer "rugged", thereby providing a larger surface area and a higher capacitance when used as a storage electrode. Substantially, a stacked structure of the pad polysilicon layer, the chemical oxide, and the rugged polysilicon layer is used as a storage electrode; wherein the chemical oxide has to be used to form the grains of the rugged polysilicon layer 80 according to the production experience, Although the chemical oxide 70 is an insulating material, its thickness is too thin to insulate between the rugged polysilicon layer 80 and the pad polysilicon layer 60. Prior to depositing a dielectric layer of Oxide-Nitride-Oxide(ONO), a HF dip is necessary to clear wafers for obtaining a high quality film. Since the rugged polysilicon layer 80 is consisted of grains, HF solution will transfuse gaps between the grains to the chemical oxide layer and thus cause an oxide loss of the chemical oxide layer 70, shown in "A" location of FIG. 2. The oxide loss will reduce adhesion between the rugged polysilicon layer 80 and the chemical oxide layer 70 and thus the rugged polysilicon layer 80 is easy to peel, which results in a low production yield. Hence, it is necessary to propose a new method of forming a stacked capacitor to resolve aforesaid problems.

SUMMARY OF INVENTION

Therefore, an object of the invention is to provide a method of forming a stacked capacitor of a DRAM cell to prevent an oxide loss during a HF dip, thereby increasing a production yield.

According to the invention, by use of depositing a protection polysilicon layer on a rugged polysilicon layer, which can provide an increased surface area of a storage electrode, a chemical oxide layer underlying the rugged polysilicon layer is protected by the protection polysilicon layer during a HF dip and thus a peeling of the rugged polysilicon as a result of the chemical oxide loss will not occur, thereby preventing a production yield loss.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

Figure 1:
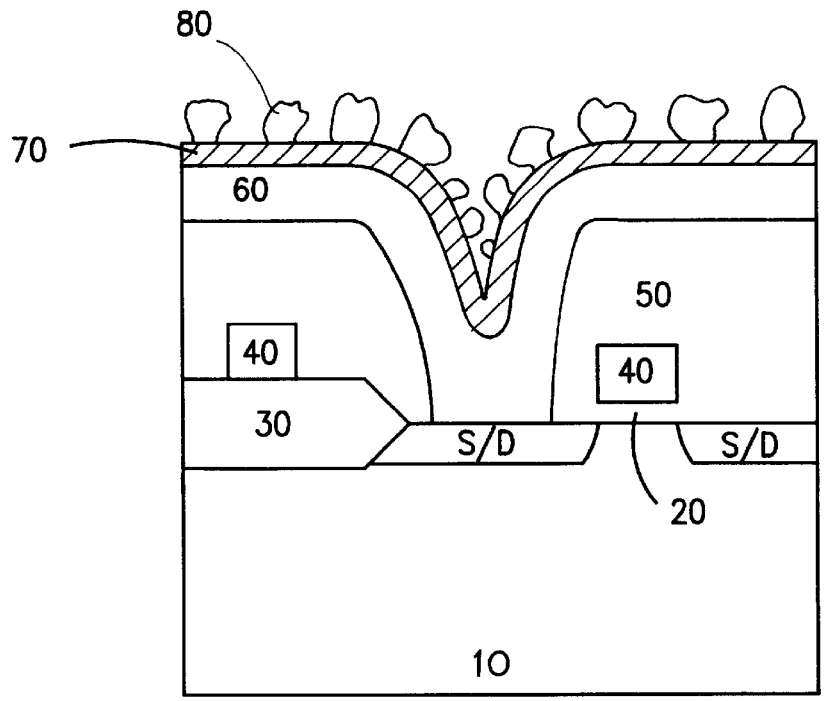
FIG. 1 is a cross-sectional view of a conventional storage electrode.
Figure 2:
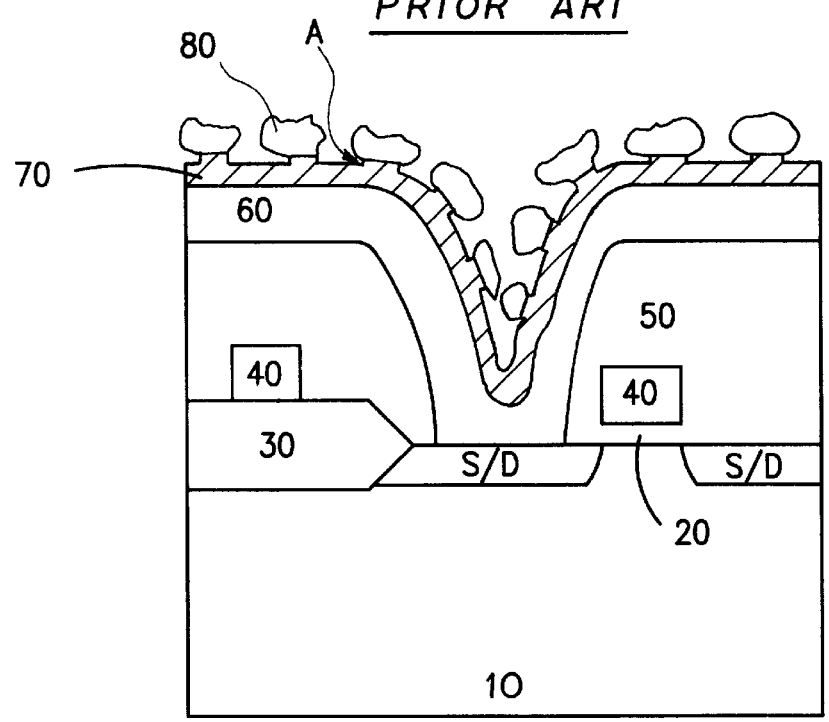
FIG. 2 is a cross-sectional view of a conventional storage electrode after a HF dip.
Figure 3:
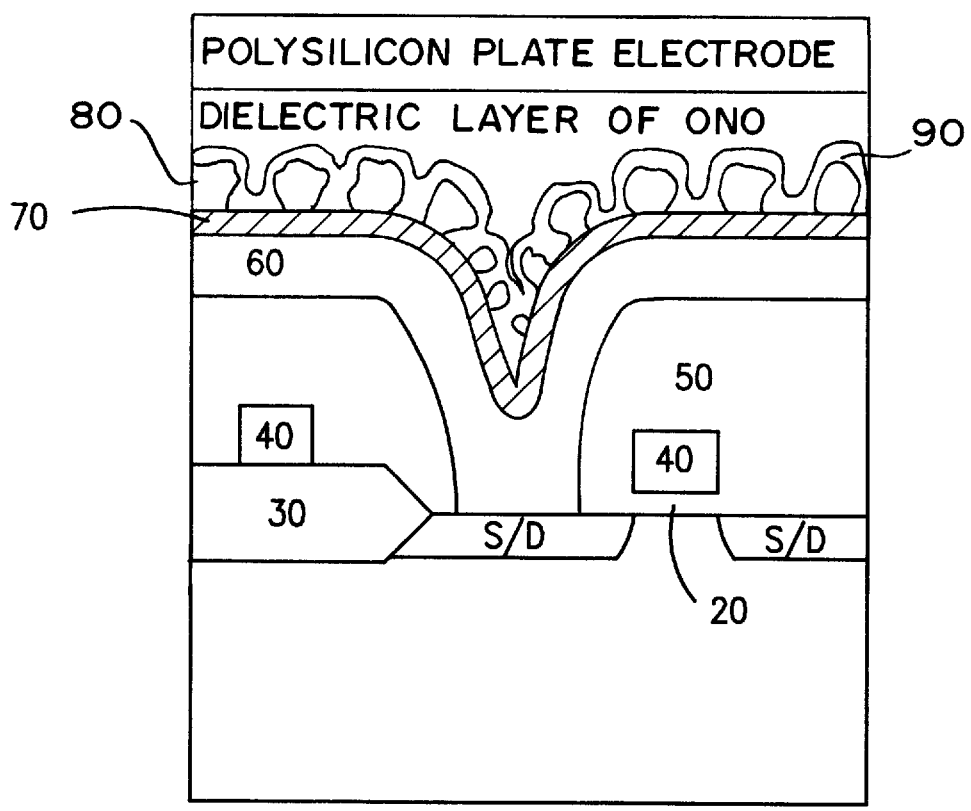
FIG. 3 is a cross-sectional view of storage electrode according to the invention.

Referring to FIG. 3, after finishing a field oxide 30, a gate oxide 20, source/drain regions S/D, and a polysilicon gate 40 over a silicon substrate 10, which are all standard IC processes and not described in detail here, a dielectric layer 50 such as $SiO_2$ is deposited to protect the polysilicon gate 40. A contact window (not shown in FIG. 3), providing a connection between source/drain regions S/D and a storage electrode, is then formed by exposing through a contact mask, developing and etching the dielectric layer 50.

Subsequently, a pad polysilicon layer is formed on the contact window by a chemical vapor deposition (CVD) method. The wafer is then immersed in a SPM solution, which is a mixed solution of $H_2SO_4$ and $H_2O_2$, to grow a porous chemical oxide 70 to a thickness of 15–20 A. Finally, a rugged polysilicon layer 80 consisting of many grains is formed by depositing an amorphous silicon layer and then annealing at a temperature of 585° C. These grains will make the polysilicon layer "rugged", thereby providing a larger surface area and a higher capacitance when used as a storage electrode. Although the chemical oxide 70 is an insulating material, its thickness is too thin to insulate between the rugged polysilicon layer 80 and the pad polysilicon layer 60.

Next, a protection polysilicon or an amorphous silicon layer 90 is deposited to a thickness of 50–200 A over the rugged polysilicon layer 80 to block a HF etching during a HF dip, which is needed before depositing a dielectric layer of ONO, thereby protecting the chemical oxide 70, as shown in FIG. 3. Substantially, a stacked structure consisting of the pad polysilicon layer 60, the chemical oxide 70, the rugged polysilicon layer 80, and the protection polysilicon layer 90 is used as a storage electrode; wherein these four layers are shorted because the chemical oxide 70 has no insulating function. Finally, a stacked capacitor is finished after first depositing a dielectric layer of ONO and then a polysilicon layer used as a plate electrode by a CVD method. Compared with the conventional storage electrode, a chemical oxide loss which causes a peeling of the rugged polysilicon layer will not occur in the invention and thus allows a higher production yield than that of conventional art.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

What is claimed is:

1. A method of forming a capacitor of a DRAM cell, comprising the steps of:

forming a field oxide, a gate oxide, source/drain regions, and a polysilicon gate over a silicon substrate;

depositing a dielectric layer of $SiO_2$;

forming a contact window by exposing through a contact mask, developing and etching the dielectric layer of $SiO_2$;

depositing a pad polysilicon layer;

forming a chemical oxide by immersing wafers in a SPM solution, which is a mixed solution of $H_2SO_4$ and $H_2O_2$;

forming a rugged polysilicon layer after depositing an amorphous silicon layer and then annealing;

depositing a protection polysilicon layer;

depositing a dielectric layer of ONO; and depositing a polysilicon layer as a plate electrode.

2. A method of forming a capacitor of a DRAM cell according to claim 1, wherein the protection polysilicon layer is replaced by an amorphous silicon layer.

3. A method of forming a capacitor of a DRAM cell according to claim 1 further comprising a HF dip before forming a dielectric layer of ONO.

* * * * *